United States Patent [19]

Bell

[11] Patent Number: 4,900,644

[45] Date of Patent: Feb. 13, 1990

[54] UNSHARP MASKING OF DIAGNOSTIC RADIATION INTENSIFYING SCREENS

[75] Inventor: Jeffrey H. Bell, Wilmington, Del.

[73] Assignee: E. I. Du Pont De Nemours and Company, Wilmington, Del.

[21] Appl. No.: 205,245

[22] Filed: Jun. 10, 1988

[51] Int. Cl.[4] .................................... G03F 1/00

[52] U.S. Cl. .................................... 430/6; 430/291; 430/967; 378/185; 250/487.1

[58] Field of Search ................. 430/4, 6, 14, 273, 291, 430/966, 967; 250/483.1, 487.1; 378/182, 185

[56] References Cited

U.S. PATENT DOCUMENTS

| | | | |
|---|---|---|---|
| 3,649,268 | 3/1972 | Chu et al. | 430/291 |
| 3,895,157 | 7/1975 | Brixner et al. | 428/220 |
| 4,053,313 | 10/1977 | Fan | 430/270 |
| 4,081,686 | 3/1978 | Nieuweboer | 250/480 |
| 4,174,216 | 11/1979 | Cohen et al. | 430/257 |
| 4,191,572 | 3/1980 | Cohen et al. | 430/260 |
| 4,243,741 | 1/1981 | Abele et al. | 430/270 |
| 4,472,828 | 9/1984 | Ferlic | 378/147 |
| 4,701,622 | 10/1987 | Koizumi et al. | 250/486.1 |
| 4,772,803 | 9/1988 | Horiuchi et al. | 250/487.1 |
| 4,816,350 | 3/1989 | Horiuchi et al. | 428/690 |

FOREIGN PATENT DOCUMENTS

| | | | |
|---|---|---|---|
| 0158787 | 10/1985 | European Pat. Off. . | |
| 73400 | 6/1981 | Japan | 250/483.1 |

OTHER PUBLICATIONS

Mees, C. E. Kenneth, *The Photographic Theory and Process*, The MacMillan Co., 1942 Edition, pp. 201–208.

Sorenson, J. A. et al., "Photographic Unsharp Masking in Chest Radiography", *Investigative Radiography*, Jul.-Aug. 1981, vol. 16, No. 4, pp. 281–288.

*Primary Examiner*—Jose G. Dees

[57] ABSTRACT

This invention relates to a gradient radiation intensifying screen having as an integral part thereof a tonable, photosensitive layer bearing a toned, anatomically correct, unsharp halftone image.

17 Claims, 1 Drawing Sheet

UNSHARP MASKING OF DIAGNOSTIC RADIATION INTENSIFYING SCREENS

FIELD OF THE INVENTION

This invention relates to a radiation intensifying screen and, more particularly, to a radiographic intensifying screen having as an integral part thereof an unsharp mask which filters at least part of the radiation emitted by the screen.

BACKGROUND OF THE INVENTION

In diagnostic imaging, and more particularly in medical diagnostic imaging of the type using penetrating radiation such as X-rays in combination with a detection system comprising an intensifying screen/photographic film combination, the diagnostic utility of the resulting image is frequently limited by the difficulty of achieving proper visualization of a variety of tissues with a single exposure. For example, the screen/film combination has a limited ability to adequately reproduce the full spectrum of density variations generated by the varying absorption of penetrating radiation by a patient's different tissues.

The chest, for example, contains tissues exhibiting widely varying densities with respect to penetration of radiation, and it is relatively difficult to adequately visualize dense, bony central mediastinal tissues, such as the spine, without overexposing air-filled lung tissues. Even with the wide exposure latitude in today's films, the relatively radiopaque areas of a chest image, such as central mediastinal, subdiaphragmatic and peripheral areas of the lung tend to be underexposed. As a result they are reproduced in the film with insufficient contrast, their exposure levels being primarily within the open "toe" region of the characteristic curve, the "H and D curve", of the film. Increasing the exposure to adequately visualize these denser tissues results in overexposure and loss of detail in the image of the less dense tissues. [For a full discussion of the characteristic curve, or "H and D" curve for short, named after F. Hurter and V. C. Driffield who first developed it in 1890, see *The Photographic Theory and Process* by C. E. Kenneth Mees, The MacMillan Company, 1942 Edition, pages 201–208. The "toe" region of the H and D curve is that part of the curve referred to in Mees, above, as the "induction period".]

To resolve this system deficiency, one may use a filter to selectively reduce the intensity of the penetrating radiation directed to the patient. This allows more radiation to be directed to relatively more dense tissues. U.S. Pat. No. 4,472,828 shows a typical such approach. In the alternative, the intensifying screen may be manufactured to produce a lower intensity output in areas of the image that will normally be overexposed if a sufficiently strong radiation exposure is given to produce adequate output in the areas that otherwise would fall in the "toe" region of the film H-D curve. One way to accomplish this is to selectively increase the thickness of the phosphor layer on the intensifying screen, thereby increasing the light emitted in the corresponding areas.

Another approach, exemplified by EPO Published Patent Application No. 0 158 787, is to dye the transparent protective layer of the intensifying screen. The dye absorbs light in much the same way as optical filters are used to reduce exposure of traditional photographic films. The dye can be applied by immersing the intensifying screen in the dyestuff solution, and the degree of dying of the protective layer can be varied by immersing the screen to a predetermined depth, and then gradually removing it. In this manner, various simple geometric patterns can be achieved. The color strength can also be made to vary continuously so that there is no boundary line.

A better approach has been disclosed in an article appearing in *Investigative Radiology* 16, No. 4, 281 (July-August 1981) entitled "Photographic Unsharp Masking in Chest Radiography", by J. A. Sorenson, L. T. Niklason and J. A. Nelson. Dr. Sorenson et al., used two exposures to obtain an X-ray image with adequate diagnostic quality. In a first exposure, an unsharp image of the patient's chest is produced. The unsharp image or "mask" is then placed between the X-ray intensifying screen and a second, unexposed film, and a second exposure given to the patient. The unsharp mask absorbs light from the screen in those areas of the chest that normally are well penetrated, preventing overexposure of those areas and resulting in an improved balance of densities across the entire chest radiograph.

The unsharp image masks the output of the intensifying screen in direct proportion to the original unmasked intensity, thus always shifting the available imaging intensity away from the ends of the H-D curve to the middle, high contrast region. Since the filter image is unsharp, it does not produce artifactual lines or shadows in the final product.

While the method taught by Sorenson et al. may produce the best results, it suffers in that the patient must be exposed to radiation twice to produce a single diagnostic image, and the final radiograph is delayed by the time it takes to prepare and process the unsharp mask. Furthermore, the film bearing the unsharp image must be correctly identified and placed in the cassette in proper alignment. Also, the thickness of the masking film interposed between the screen and the unexposed film acts as a spacer and adversely affects image resolution.

BRIEF SUMMARY OF THE INVENTION

It has now been discovered that excellent results may be obtained with an intensifying screen bearing on its surface a photosensitive layer having thereon a toned, anatomically correct but generalized unsharp image of a body part or other object to be examined.

Such a masked intensifying screen, comprises in order, a sheet support, a fluorescent layer on the support, and a masking layer adhered to the fluorescent layer, wherein the masking layer comprises a photosensitive layer bearing a toned, anatomically correct unsharp masking layer on an intensifying screen, said process comprising, in the stated order, the steps of:

(a) providing an intensifying screen, comprising in order, a support, a fluorescent layer on the support, and a tonable photosensitive layer adhered to the fluorescent layer, (b) exposing said tonable photosensitive layer to actinic radiation through a transparency containing an anatomically correct unsharp halftone image to produce a tonable latent image thereon, and, (c) toning the exposed photosensitive layer to develop the unsharp halftone image.

DETAILED DESCRIPTION OF THE INVENTION

Figure 1:
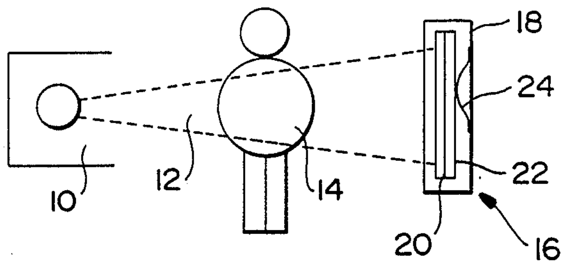
FIG. 1 is a schematic representation of an exposure station in accordance with this invention.
Figure 2:
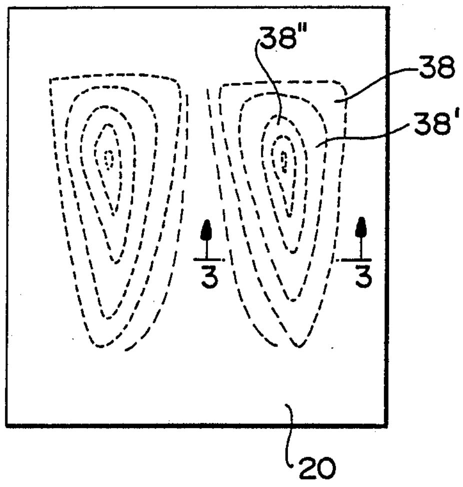
FIG. 2 shows a schematic plan view of a radiation intensifying screen built in accordance with the present invention.
Figure 3:
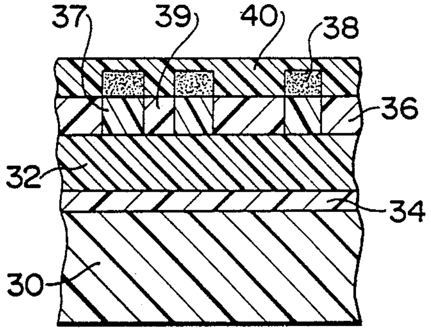
FIG. 3 shows schematic detailed cross section of a radiation intensifying screen in accordance with this invention taken along lines 3—3 in FIG. 2.

The invention will be best understood with reference to the drawings in all of which the same numbers are used to designate the same parts. With reference to FIG. 1 there is shown in generalized form a diagnostic station comprising a source of penetrating radiation 10 such as an X-ray radiation source. Emitted radiation 12 is directed through an object under investigation, i.e., a patient 14 to impinge onto a radiation detecting and recording device 16. The detecting and recording device comprises an enclosure in which there is placed an energy conversion device, such as an intensifying screen 20 in contact with a photographic film 22. A spring loading means 24 may be provided to assure intimate contact between the intensifying screen and the film. In practice, the detecting and recording device 16 may be an X-ray cassette such as disclosed in U.S. Pat. No. 4,081,686, assigned to the assignee of the present invention, and showing in detail a book type cassette useful for keeping in a light-tight environment a sheet of photographic film in intimate contact with an X-ray intensifying screen. FIGS. 2 and 3 show in greater detail an intensifying screen constructed in accordance with the present invention. The intensifying screen 20 is constructed as follows:

On a polyester sheet base 30 there is coated a light emitting layer 32 containing a mixture of phosphor particles in a binder. Interposed between the base 30 and the phosphor containing layer there is a reflective layer comprising potassium titanate dispersed in a binder. The reflective layer enhances the luminous output of the screen. U.S. Pat. No. 3,895,157 to Brixner et al., the teaching of which is hereby incorporated by reference, describes intensifying screens useful in the practice of this invention. Other intensifying screens known to those skilled in the art may also be used.

In accordance with the present invention, there is placed over the light emitting layer 32 a tonable, photosensitive layer 36. This tonable, photosensitive layer is preferably a photohardenable layer, which may be a photopolymerizable layer such as positive working Cromalin® proofing film manufactered by E. I. du Pont de Nemours and Company, Wilmington, DE, and available for use by the printing industry. While Cromalin® proofing film is preferred, other photopolymerizable or photocrosslinkable layers may be used. U.S. Pat. No. 3,649,268 to Chu and Cohen discloses a number of formulations which may be used to produce a color proofing film layer useful in practicing this invention. Other types of positive or negative working tonable, photosensitive layers or elements such as those taught by Cohen and Fan, U.S. Pat. No. 4,174,216 and 4,191,572, by Fan, U.S. Pat. 4,053,313, and those taught by Abele et al., U.S. Pat. No. 4,243,741, may also be employed.

When Cromalin® proofing film is used for layer 36, it is first laminated onto the light emitting layer 32. A halftone transparency containing an unsharp, anatomically correct generalized image of the desired anatomical area is placed over the proofing film layer. Using a light source with actinic output appropriate for exposing the proofing film, tacky, 37, and non-tacky, 39, areas are produced on the proofing film. The tacky areas correspond to the portions of the unsharp, anatomically correct image areas through which it is desirable to reduce the light transmission to the photosensitive film 22. If positive working Cromalin® proofing film is selected, then the halftone transparency is an image of the original radiogram but with its densities reversed, i.e., a negative of the original radiogram.

Following this exposure, an appropriate toning material, preferably comprising pigmented particles, is applied to the proofing film surface. The toning material adheres to the tacky portions 37 of the proofing film 36 surface to produce toned areas 38 through which the amount of light transmitted is reduced. The toned areas may have a different density overall, (38, 38', 38" etc.) forming a mask which absorbs light in different degrees over different portions of the screen. Since the different density areas 38, 38' & 38" have been created using an anatomically correct image, the masking and ensuing light filtering is also anatomically correct.

The use of a generalized rather than individualized image avoids the need to take two X-rays of the patient in order to produce a single diagnostic image. There may of course be circumstances where it is necessary or desirable to produce an individualized mask.

Following toning, a second color proofing film layer 40 is placed over layer 36 and exposed uniformly to become hardened and provide a protective layer covering the toned image. Alternatively, a non-photosensitive protective layer is applied as a cover to the toned image.

The halftone transparency containing the unsharp generalized, anatomically correct image, may be produced by one of several methods. Preferably, a radiograph is first made of a high quality anatomical phantom of a desired body part, i.e., a human chest, skull, pelvis, etc., using regular X-ray film imaging techniques. The phantom is a three dimensional reproduction of a human body part having variable X-ray absorption characteristics that correspond to the absorption characteristics of the human body. This is obtained by incorporating in the phantom different density materials, shaped to represent particular body parts to simulate the relative X-ray absorption of the corresponding human parts.

The exposed film is developed to produce a master radiogram. The master radiogram densities are then reversed by contact exposure of a subtraction film, and the subtraction film is used to prepare a halftone transparency using preferably a high quality halftone scanner, with a fine dot pattern.

A more generalized image may be similarly produced using wedges instead of a phantom in the X-ray radiation path to generate areas of variable densities in the master radiogram. Typically such wedges are produced of machined aluminum blocks, and provide variable X-ray absorption in proportion to the material thickness interposed in the X-ray path.

Alternatively, a master radiogram may not be used at all and an artist's pictorial rendition of either a generalized or, if desired, an individualized image of a patient's anatomy may be used as the original for the production of a halftone transparency using standard printing technology and equipment. In this instance, depending on the nature of the original drawing, density reversal may or may not be required.

The final image is reproduced slightly out of focus ("unsharp"), to prevent artifactual lines or shadows from appearing in the diagnostic image.

Even though the mask is produced using a halftone image, the dot pattern does not appear to produce any visible distracting artifacts on the final image.

In practice, an intensifying screen bearing an appropriate body portion mask is mounted in a cassette in the same manner as usual. The cassette now becomes dedicated to using for picture taking of the corresponding body part. A film sheet is loaded and the patient placed between the radiation source and the cassette. Positioning markings allow the appropriate alignment between the patient and the cassette, ensuring that the masking on the screen corresponds to the patient's anatomy. An exact fit does not appear necessary and images of diagnostic quality are produced for a variety of patients using the same generalized, anatomically correct masking image.

Those having the benefit of the teachings contained herein will realize that numerous modifications are feasible within the scope of the invention. For example, while the foregoing discussion focuses on the medical applications of the instant invention, it is recognized that the invention is equally applicable to radiography for industrial purposes, such as the non-destructive inspection of materials. In that case, the masking pattern to be "anatomically correct" will be the inverse of the radiographic density pattern of the object to be radiographed, i.e., the masking will be most dense in those areas which permit the greatest X-ray transmission and vice versa.

What is claimed is:

1. A masked intensifying screen, comprising, in order, a sheet support, a fluorescent layer on the support, and a masking layer adhered to the fluorescent layer, wherein the masking layer comprises a photosensitive layer bearing a toned, anatomically correct, unsharp halftone image.

2. A masked intensifying screen according to claim 1, wherein the photosensitive layer is photohardenable.

3. A masked intensifying screen according to claim 1, wherein the photosensitive layer is laminated onto the fluorescent layer.

4. A masked intensifying screen according to claim 1, wherein the toned, anatomically correct, unsharp halftone image is a generalized image.

5. A masked intensifying screen according to claim 2, wherein the toned, anatomically correct, unsharp halftone image is a generalized image.

6. A masked intensifying screen according to claim 2, wherein said anatomically correct, unsharp halftone image is an individualized image.

7. A masked intensifying screen according to claim 1, wherein the photosensitive layer is toned with a finely divided particulate material.

8. An X-ray cassette having a masked intensifying screen according to claim 1 affixed therein.

9. An X-ray cassette having a masked intensifying screen according to claim 5 affixed therein.

10. A process for making a masked intensifying screen, said process comprising, in the stated order, the steps of:

(a) providing an intensifying screen, comprising in order, a sheet support, a fluorescent layer on the support, and a tonable photosensitive layer adhered to the fluorescent layer.

(b) exposing said tonable photosensitive layer to actinic radiation through a transparency containing an anatomically correct, unsharp halftone image to produce a tonable latent image thereon, and, (c) toning the exposed photosensitive layer to develop the unsharp halftone image.

11. A process according to claim 10, wherein the photosensitive layer is laminated to the surface of the fluorescent layer.

12. A process according to claim 10, wherein the photosensitive layer is a photohardenable layer.

13. A process according to claim 10, wherein the photosensitive layer is toned by application of finely divided particulate material.

14. A process according to claim 10, wherein the process further comprises a step (d) wherein a protective layer is applied over the toned photosensitive layer.

15. A process according to claim 10, wherein the anatomically correct unsharp halftone image is a generalized image.

16. A process according to claim 12, wherein the anatomically correct unsharp halftone image is a generalized image.

17. A process according to claim 14, wherein the anatomically correct unsharp halftone image is a generalized image.

* * * * *